United States Patent
Suguro

(10) Patent No.: US 9,029,247 B2
(45) Date of Patent: May 12, 2015

(54) MANUFACTURING METHOD OF SEMICONDUCTOR DEVICE AND SEMICONDUCTOR MANUFACTURING APPARATUS

(71) Applicant: Kabushiki Kaisha Toshiba, Tokyo (JP)

(72) Inventor: Kyoichi Suguro, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/016,662

(22) Filed: Sep. 3, 2013

(65) Prior Publication Data

US 2014/0065805 A1    Mar. 6, 2014

(30) Foreign Application Priority Data

Sep. 5, 2012   (JP) ................................ 2012-195474

(51) Int. Cl.
| | |
|---|---|
| *H01L 21/20* | (2006.01) |
| *H01L 21/36* | (2006.01) |
| *H01L 21/02* | (2006.01) |
| *H01L 21/67* | (2006.01) |
| *H01L 21/324* | (2006.01) |

(52) U.S. Cl.
CPC .... *H01L 21/02592* (2013.01); *H01L 21/67011* (2013.01); *H01L 21/02532* (2013.01); *H01L 21/0262* (2013.01); *H01L 21/02667* (2013.01); *H01L 21/02672* (2013.01); *H01L 21/324* (2013.01)

(58) Field of Classification Search
USPC ................................................. 438/486, 487
See application file for complete search history.

(56) References Cited

U.S. PATENT DOCUMENTS

| | | | |
|---|---|---|---|
| 6,077,759 A * | 6/2000 | Yamazaki et al. ............ 438/487 |
| 8,324,086 B2 * | 12/2012 | Shimomura et al. .......... 438/479 |
| 2004/0017365 A1 * | 1/2004 | Hatano et al. ................. 345/204 |
| 2007/0098916 A1 | 5/2007 | Stowell |
| 2009/0255800 A1 | 10/2009 | Koshimizu |
| 2011/0217811 A1 * | 9/2011 | Tanaka et al. .................... 438/97 |
| 2013/0029497 A1 * | 1/2013 | Chin et al. ..................... 438/758 |

FOREIGN PATENT DOCUMENTS

| | | |
|---|---|---|
| JP | H02-197577 | 8/1990 |
| JP | H06-73568 | 3/1994 |
| JP | 2002-197577 A | 7/2002 |
| JP | 2006-073568 A | 3/2006 |
| JP | 2007-126749 A | 5/2007 |
| JP | 2009-246091 A | 10/2009 |

* cited by examiner

*Primary Examiner* — Karen Kusumakar
(74) *Attorney, Agent, or Firm* — Patterson & Sheridan LLP

(57) ABSTRACT

According to one embodiment, a manufacturing method of a semiconductor device includes forming a crystal film on a semiconductor substrate by irradiating the semiconductor substrate with a first microwave, obtained by providing frequency modulation or phase modulation of a first carrier wave which is a sine wave with a first frequency, using a first signal wave which is a sine wave or a pulse wave with a third frequency lower than a first frequency, and irradiating the semiconductor substrate with a second microwave, obtained by providing frequency modulation or phase modulation of a second carrier wave, which is a sine wave with a second frequency higher than the first frequency, using a second signal wave which is a sine wave or a pulse wave with a fourth frequency lower than the second frequency.

18 Claims, 16 Drawing Sheets

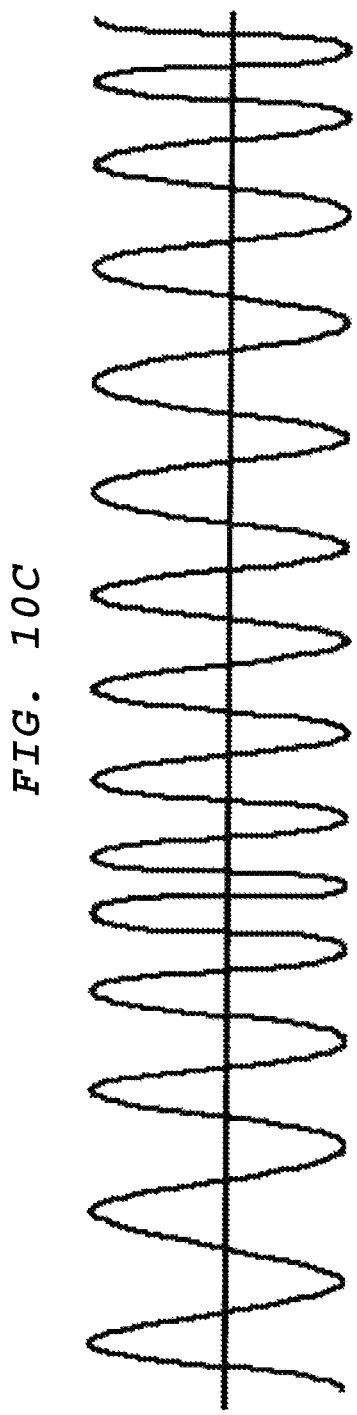

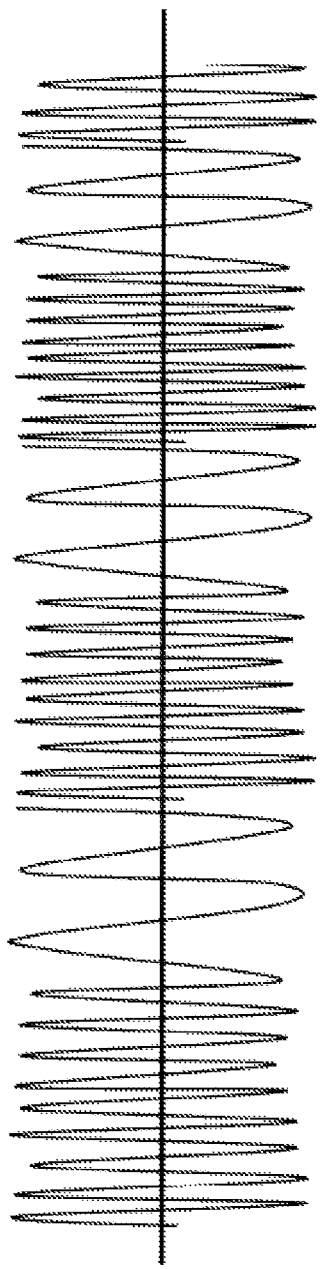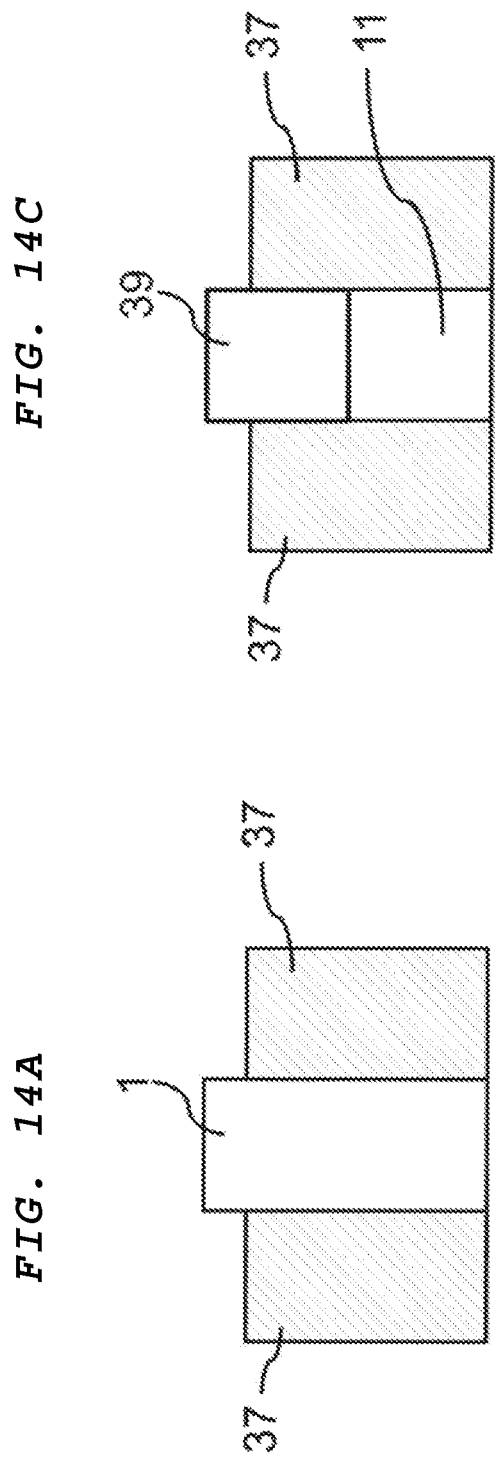

MANUFACTURING METHOD OF SEMICONDUCTOR DEVICE AND SEMICONDUCTOR MANUFACTURING APPARATUS

CROSS-REFERENCE TO RELATED APPLICATION

This application is based upon and claims the benefit of priority from Japanese Patent Application No. 2012-195474, filed Sep. 5, 2012; the entire contents of which are incorporated herein by reference.

FIELD

Embodiments described herein relate to a manufacturing method of a semiconductor device and a semiconductor manufacturing apparatus.

BACKGROUND

In recent years, large-scale integrated circuits (LSI), which are integrally formed on one chip by connecting plural transistors, resistors and so on as an electric circuit, are frequently used as essential parts of computers and communication instruments. For this reason, the performance of the entire instrument is largely related to the performance of an LSI formed on a single chip, i.e. "a simplex LSI". The enhanced performance of a simplex LSI can be achieved by increasing the degree of integration therein, namely, by the miniaturization of the elements thereof. The miniaturization of elements, for example in the case of the MOS field effect transistor (MOS transistor), can be achieved by shortening the gate length and thinning of the source and drain area regions.

A nonvolatile high density memory, such as a flash memory, as well as memories such as dynamic RAM, MRAM, PC-RAM Re-Ram and so on, LOGIC-LSI, SRAM, System LSI and others require a lower processing temperature as the miniaturization thereof progresses.

DESCRIPTION OF THE DRAWINGS

FIGS. 10A to 10C are drawings to explain a microwave according to a fourth embodiment.

FIGS. 13A to 13C are drawings to explain a microwave according to the fifth embodiment.

FIGS. 14A to 14C are cross sections, showing the manufacturing method of a semiconductor device according to another embodiment.

DETAILED DESCRIPTION

Figure 1A:
FIGS. 1A to 1C are cross sections, showing a manufacturing method according to a first embodiment.

Embodiments provide a manufacturing method of a semiconductor device from which a high quality films with few crystal grain boundaries can be obtained, and a semiconductor manufacturing apparatus to be used for manufacturing the semiconductor device.

In general, embodiments of the invention will be explained using the drawings. However, this disclosure is not limited to the embodiments shown. Common reference numerals for common elements in the drawings are used, and additional explanations are omitted for brevity. Also, the drawings are schematic drawings for explaining the embodiments and for promoting the understanding of the embodiments. In the drawings, some parts of the shapes, measurements, ratios and so on are different from the actual device, but the designs can be appropriately modified, taking into consideration the following explanations and publicly known techniques.

According to one embodiment, a manufacturing method of a semiconductor device comprises forming a crystal film on a semiconductor substrate by irradiating a first microwave energy, obtained by executing frequency modulation or phase modulation of a first carrier wave, which is a sine wave with a first frequency, using a first signal wave, which is a sine wave or a pulse wave with a third frequency lower than the first frequency; and a second microwave, obtained by executing frequency modulation or phase modulation of a second carrier wave, which is a sine wave with a second frequency higher than the first frequency, using a second signal wave, which is a sine wave or a pulse wave with a fourth frequency lower than the second frequency.

First Embodiment

Figure 1B:
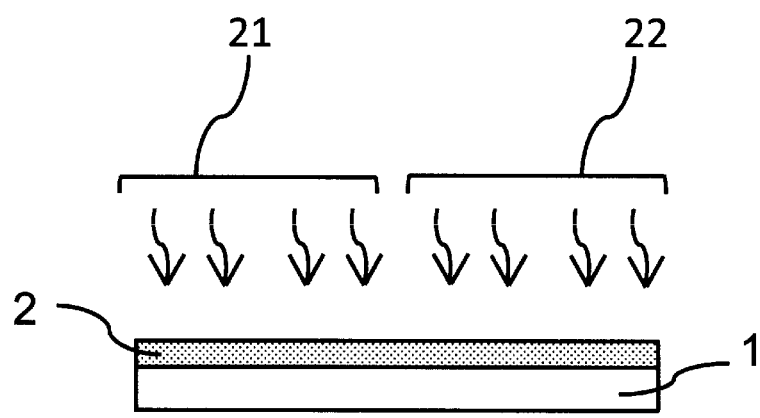
Figure 1C:

The manufacturing method of a semiconductor device according to one embodiment will be explained using FIGS. 1A to 1C. FIGS. 1A to 1C are cross sections of a main part of the semiconductor device, showing a manufacturing process of the semiconductor device according to a first embodiment. To be explained here is, as an example, an amorphous silicon film is formed on a semiconductor substrate in order to form a silicon crystal film by irradiating the amorphous silicon film with microwaves. However, this disclosure is not limited to the example and can be applied to other processes and materials.

First, as shown in FIG. 1A, by an LP-CVD (Low Pressure Chemical Vapor Deposition) method, an amorphous silicon film 2 with a thickness of 5 to 10 nm is formed on a semiconductor substrate 1, using $Si_2H_6$ and $SiH_4$ as source gases and allowing the source gases to flow in this order.

Further, as shown in FIG. 1B, the amorphous silicon film on the semiconductor substrate 1 is crystallized by irradiating the semiconductor substrate 1, with a microwave (the first microwave energy) 21 having a frequency of 5.8 GHz or in the neighboring frequency band (a first frequency), and a microwave (the second microwave energy) 22 with a frequency greater than the first frequency, that is, greater than 5.8 GHz (second frequency). In the following explanation, a microwave with the frequency of 5.8 GHz is not limited to the frequency of 5.8 GHz, but also includes a microwave which includes frequencies around 5.8 GHz due to the frequency fluctuation induced by a device producing a microwave with the frequency of 5.8 GHz, or the frequency fluctuation induced by external factors during the manufacturing process of the semiconductor device; or a microwave produced by combining multiple microwaves with a certain frequency within the frequency band in a specified range with the central frequency being 5.8 GHz, in other words, broadband microwaves. Also to be explained here is the instance in which two microwaves with different frequencies are simultaneously irradiated; however, this disclosure is not limited to simultaneous irradiations, but as described in the second embodiment to be explained later, microwaves can be irradiated sequentially. Also, a method of "irradiating two microwaves with different frequencies simultaneously" is not limited to irradiating the semiconductor substrate 1 using the same waveguide, but can also include irradiating the semiconductor substrate 1 separately using different waveguides.

Also, in FIG. 1B, microwaves of different frequencies are irradiated on different areas of the semiconductor substrate 1. In this embodiment, the semiconductor substrate 1 may be rotated with the vertical axis against the surface of the semiconductor substrate 1 about its center as the rotational axis. The rotation can prevent deterioration of uniformity of the amount of irradiation of the microwaves within the surface of the semiconductor substrate 1. The non-uniformity may be due to the relation of the strength of the irradiated microwaves to the distance from the waveguide. Or, the non-uniformity within the surface of the substrate 1 can also be prevented by irradiating the semiconductor substrate 1 with multiple microwaves having frequencies in a frequency band within a specified range from the central frequency, in other words, a broadband microwave. Here, uniformity within the surface can be further improved by slightly sliding or moving the semiconductor substrate 1 (for example, within 10 mm) to and away from the position of the rotational axis as the semiconductor substrate 1 is rotated. As the standing wave of the microwave becomes fixed, the movement makes it possible to minimize the amount of irradiation to the semiconductor substrate 1 thereby preventing loss of uniformity within the surface of the semiconductor substrate 1. This will be the same in the case of irradiating the semiconductor substrate 1 with multiple microwaves having different frequencies. Specifically, it is possible to prevent the deterioration of uniformity based on the amount of irradiation of the microwaves on the semiconductor substrate 1 due to the relation of the strength of the microwaves to the distance from the waveguide, by rotating and/or sliding the semiconductor substrate 1 relative to the rotational axis. Or, the deterioration of uniformity can also be prevented by irradiating on the semiconductor substrate 1 with multiple microwaves with a certain frequency in a frequency band within a specified range from the central frequency. Here, as in the above explanation, the uniformity within the surface can be further improved by slightly sliding the position of the rotational axis for the semiconductor substrate 1 from the center of the semiconductor substrate 1 when semiconductor substrate 1 is turned, because the standing waves of the microwaves become fixed, making it possible to avoid the amount of irradiation to the semiconductor substrate 1 from losing uniformity within the surface.

In this embodiment, as the second frequency, frequencies over 8 GHz may be used and frequencies between 20 GHz and 30 GHz may also be used. The microwave 21, which has a frequency of 5.8 GHz or in its neighboring frequency band can be produced, for example, by using a magnetron power source. The second microwave 22 with the second frequency can be produced, for example, by using the gyrotron.

The most suitable duration (time) of the irradiation of the microwaves 21 and 22 should be determined based on the property of the materials and the surface area of the materials onto which the microwaves are irradiated. The property of the material and the surface area of the materials where the microwaves are not irradiated must also be taken into consideration. Further, the properties and type of the semiconductor device to be eventually obtained by the process must also be determined. As an example, the duration of the irradiation of the microwaves 21 and 22 will be from one minute to ten minutes for each semiconductor substrate 1.

The power of the microwaves 21 and 22 to irradiate is, for example, from 1,500 to 2,500 W, and the power density may be set, for example, between 2.1 W per square centimeter and 3.6 W per square centimeter. If the irradiation power of the microwaves 21 and 22 is increased, the duration of irradiation of the microwaves 21 and 22 can be decreased, but the temperature of the semiconductor substrate 1 will increase. Because of that, sometimes other areas on the semiconductor substrate 1 are negatively affected. Therefore, it is preferable to set the irradiation power of the microwaves 21 and 22 so that such a problem can be avoided. Also, if the irradiation power of the microwaves 21 and 22 is increased, an abnormal discharge (arcing) becomes likely to occur in a process chamber. To avoid an abnormal discharge, the pressure within the process chamber may be maintained to about 1 atm. Here, the temperature of the semiconductor substrate 1 during the irradiation of the microwaves 21 and 22 varies depending on process conditions and the like, but the temperature of the semiconductor substrate 1 may be maintained below 500° C.

In this way, as shown in FIG. 1C, a silicon crystal film 3 can be obtained on the semiconductor substrate 1 due to the crystallization of the amorphous silicon film 2 by irradiating the microwaves 21 and 22 onto the semiconductor substrate 1.

As shown in this embodiment, by irradiating the amorphous silicon film 2 with the microwaves 21 and 22 having two different frequencies, a high quality silicon crystal film 3 with a large grain diameter, and therefore with less grain boundaries, can be obtained.

The mechanism in which high quality silicon crystal film 3 can be obtained in this embodiment will be explained in the following.

Figure 2:
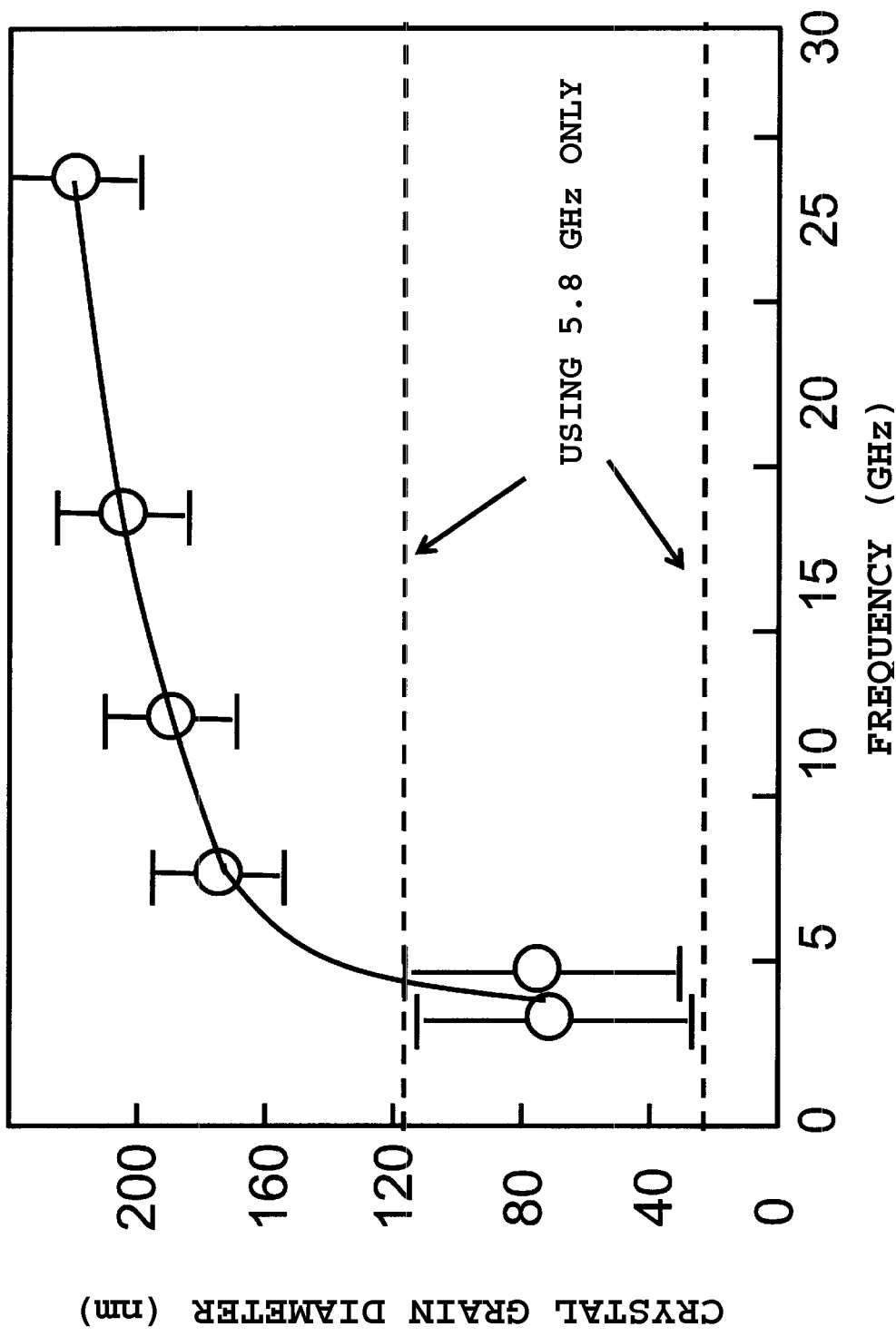
FIG. 2 shows a relation between frequency of irradiating microwave and grain diameter of crystal grain in a silicon crystal film.

FIG. 2 shows the relation between the frequency of the microwave 22 and the grain diameter of silicon crystal grains formed from the amorphous silicon film. In detail, as in the embodiment explained earlier, the silicon crystal film 3 is provided by forming the amorphous silicon film 2 with a thickness of 5 to 10 nm on the semiconductor substrate 1 where a silicon oxide film has been formed, and by irradiating the semiconductor substrate 1 with the microwave 21 having the frequency of 5.8 GHz and the microwave 22 containing various frequencies to the amorphous silicon film 2. The crystal grain diameter of the silicon crystal film 3 obtained in this way is measured and FIG. 2 shows the relation between the measured crystal grain diameter and the frequency of the microwave 22.

Figure 3:
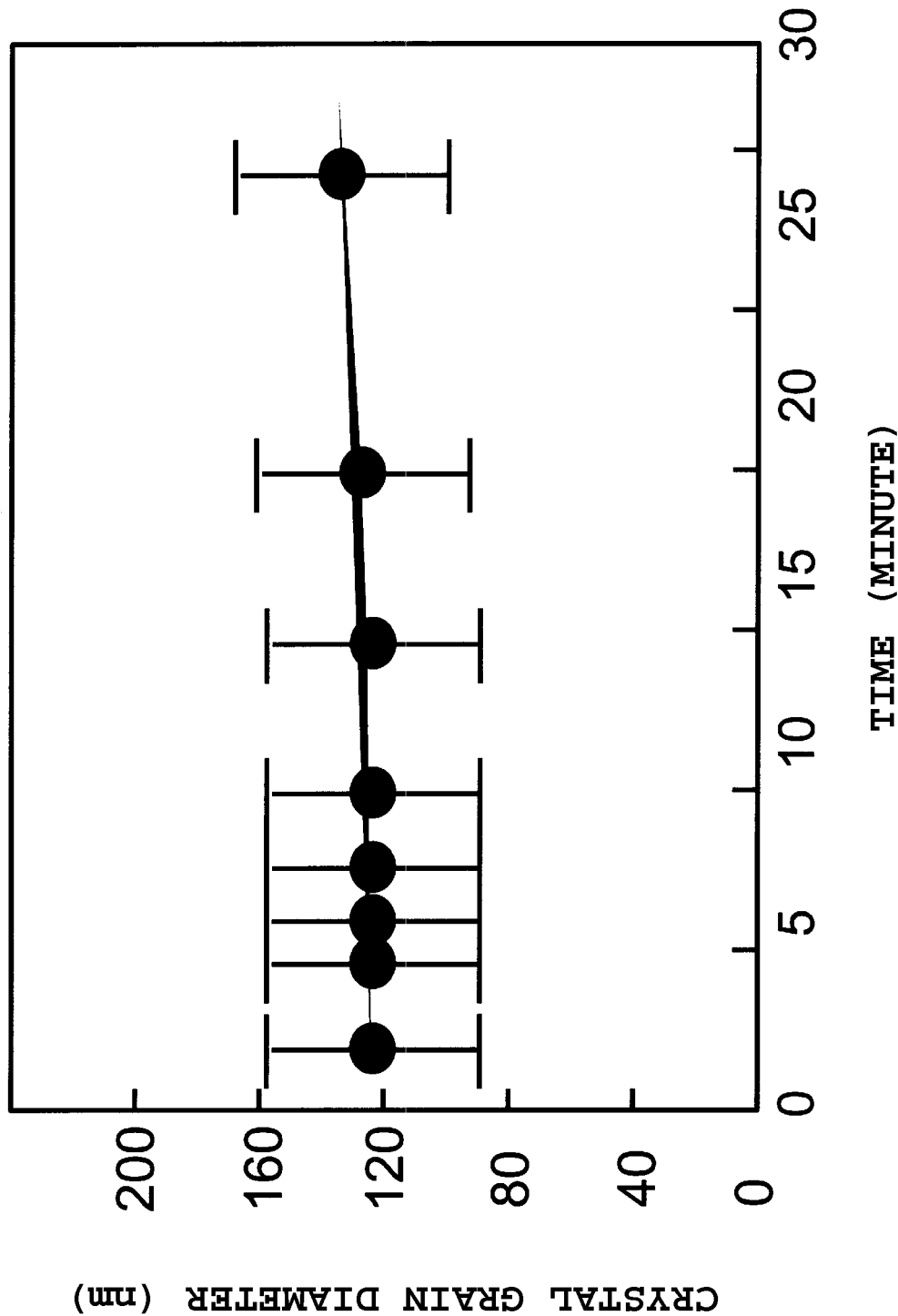
FIG. 3 shows a grain diameter of crystal grains in a silicon crystal film when the microwave of 10 GHz is irradiated.

Also, FIG. 3 shows the crystal grain diameter of the silicon crystal 3 obtained by irradiation using only the microwave 22 having the frequency of 10 GHz. In detail, other than the irradiated microwave, the sample conditions are the same as the sample conditions shown in FIG. 2. Further, the horizontal axis of FIG. 3 shows the duration of irradiation of the microwave 22 of 10 GHz, and the vertical axis shows the crystal grain diameter of the obtained silicon crystal film 3.

As can be seen in FIG. 2 and FIG. 3, when only the microwave 21 of 5.8 GHz (in FIG. 2, shown in the range with dotted lines), the crystal grain diameter is about 20 nm to 120 nm; in other words, the crystal grain diameter is small (approximately 70 nm), and the range of variation of the crystal grain diameter is also wide (approximately Δ100 nm). Also, when only the microwave 22 of 10 GHz is irradiated (see FIG. 3), the crystal grain diameter is about 120 nm, and the range of variation is wide for 480 nm. And when the microwave 21 of 5.8 GHz and the microwave 22 having a frequency of 5.8 GHz or lower are irradiated (see FIG. 2), the crystal grain diameter is small (approximately 80 nm), and the range of its variation is wide (approximately Δ80 nm). On the other hand, when the microwave 21 of 5.8 GHz and the microwave 22 having a frequency higher than 5.8 GHz (see FIG. 2) are irradiated, the crystal grain diameter is large (approximately 170 nm), and the range of its variation is narrow (approximately Δ40 nm). Especially, it can be seen that when the frequency of the microwave 22 is over 8 GHz, the crystal grain diameter is large and the range of variation is narrow.

Specifically, by irradiating the microwave 21 of 5.8 GHz and the microwave 22 having a frequency higher than 5.8 GHz, a silicon crystal grain with a large and uniform crystal grain diameter is obtained. As to this mechanism, this inventor surmises as follows.

First, what is called the microwave here indicates, when the frequency is not specified, an electromagnetic wave with a wavelength between 300 MHz (wavelength 1 m) and 300 GHz (wavelength 1 mm). Among them, especially in some cases, electromagnetic waves between 30 GHz (wavelength 10 mm) and 300 GHz (wavelength 1 mm) are called millimeter waves. The microwave is one of the electromagnetic waves, and therefore, has an electric field and magnetic field perpendicular to each other along the travelling direction of the wave. When the wave reaches the maximum amplitude, the electric and magnetic fields also become the greatest, and when the amplitude of the wave reaches zero, the electric and magnetic fields also become zero.

When these microwaves are irradiated to dielectric films, including semiconductors and insulators such as an amorphous silicon film, if there are defects (atom cavities, interlattice atoms, and un-bonded atoms), or dopants within the dielectric film, a charge distribution is generated, creating a polarized state in which some parts have more positive charges and other parts have more negative charges, and the dipole created by the polarization vibrates by the microwave. For example, if there are dopants, because the electronegativity of the impure atom and silicon atom is different, electrons incline to migrate toward the atoms that more easily attract electrons (negatively charged), and, on the other hand, the other atoms are placed in the state of deficiency of electrons (positively charged), generating the electric dipole. If the microwave is irradiated to the electric dipole generated in this manner, the dipole vibrates according to the electric field of the microwave.

In this way, for example, a microwave acts on polarized areas within the dielectric film, trying to vibrate them with the frequency that the microwave has; however, the vibrations of the polarized areas cannot keep up with the frequency of the microwave, so frictional heat is generated, which heats the film. Here, the relation between the frequency of the microwave and the heat generating electric power of the dielectric film is shown in the following equation (Equation 1).

[Equation 1]

$$P = E^2/R = E^2 \times \tan\delta \times 2\pi f C \quad \text{(Equation 1)}$$

Here, P represents an electric power relating to heat generation; E represents an AC power; R represents a resistance of the dielectric film; tan δ represents a dielectric tangent; π represents a circular constant; f represents a frequency of the microwave; and C represents a dielectric capacity of the dielectric film. From this equation, it can be seen that the higher the frequency to be used is, the larger the heat generating electric power of the dielectric film becomes.

Also, for example, if a microwave is irradiated on a silicon film, bonds among $Sp^3$ hybrid orbitals, four of which exist in a silicon atom, vibrate in a twisted manner (twisting vibration), allowing bonds in the atom to be effectively rearranged. This type of phenomenon depends on the frequency of the microwave, and according to the knowledge of this inventor, by the irradiation using a microwave with the frequency of a domestic microwave oven (2.45 GHz), the twisting vibration in a silicon atom is not generated effectively. However, by irradiation using a microwave with the frequency of 5.8 GHz, the twisting vibration can be generated very effectively, making the re-composition of atomic bonds easy. Further, by irradiation using a microwave with the frequency over 30 GHz, the twisting vibration begins to lose its ability to keep up with the frequency of the microwave, causing, as explained earlier, the generation of frictional heat.

In other words, it is believed that according to the frequency of the irradiated microwave, the effect on the film may change. Therefore, in this embodiment, a high quality silicon crystal film 3 is obtained by causing two phenomena using two microwaves with different frequencies.

Figure 4:
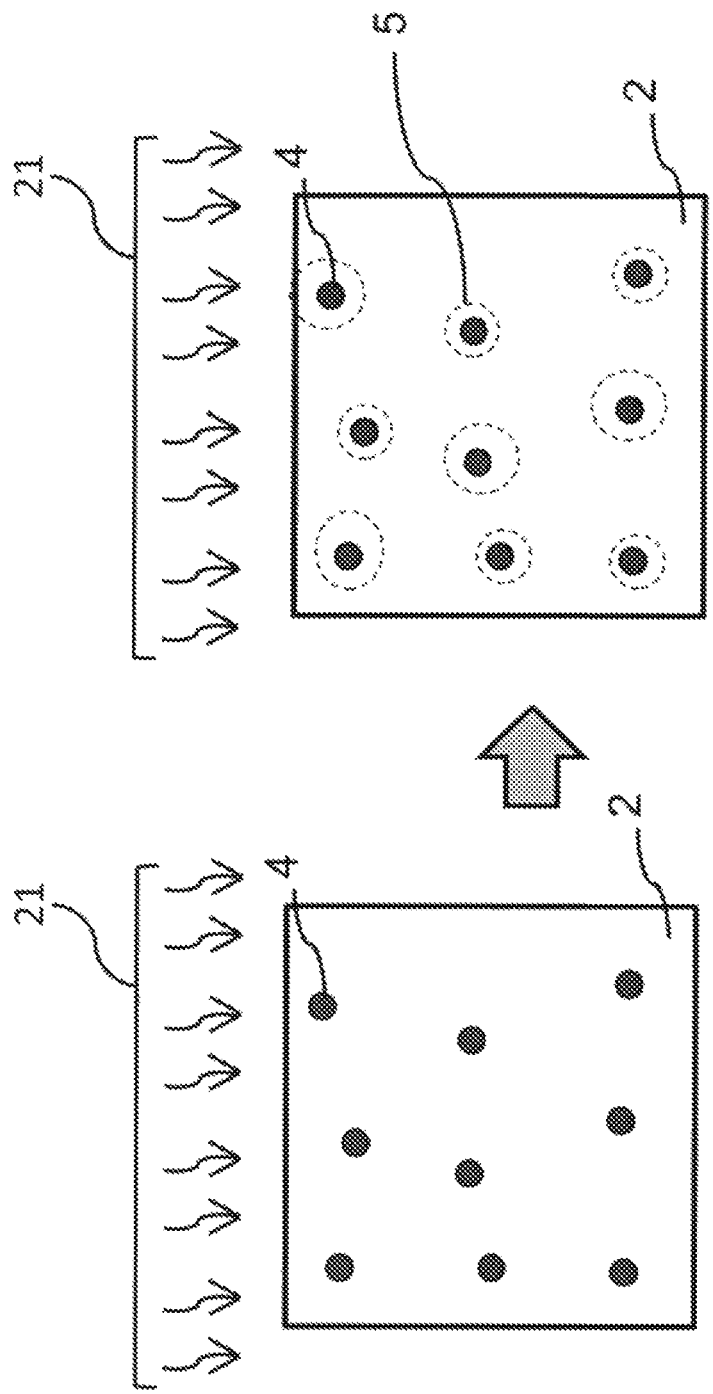
FIG. 4-FIG. 6 are drawings schematically showing a process of crystal growth.
Figure 5:
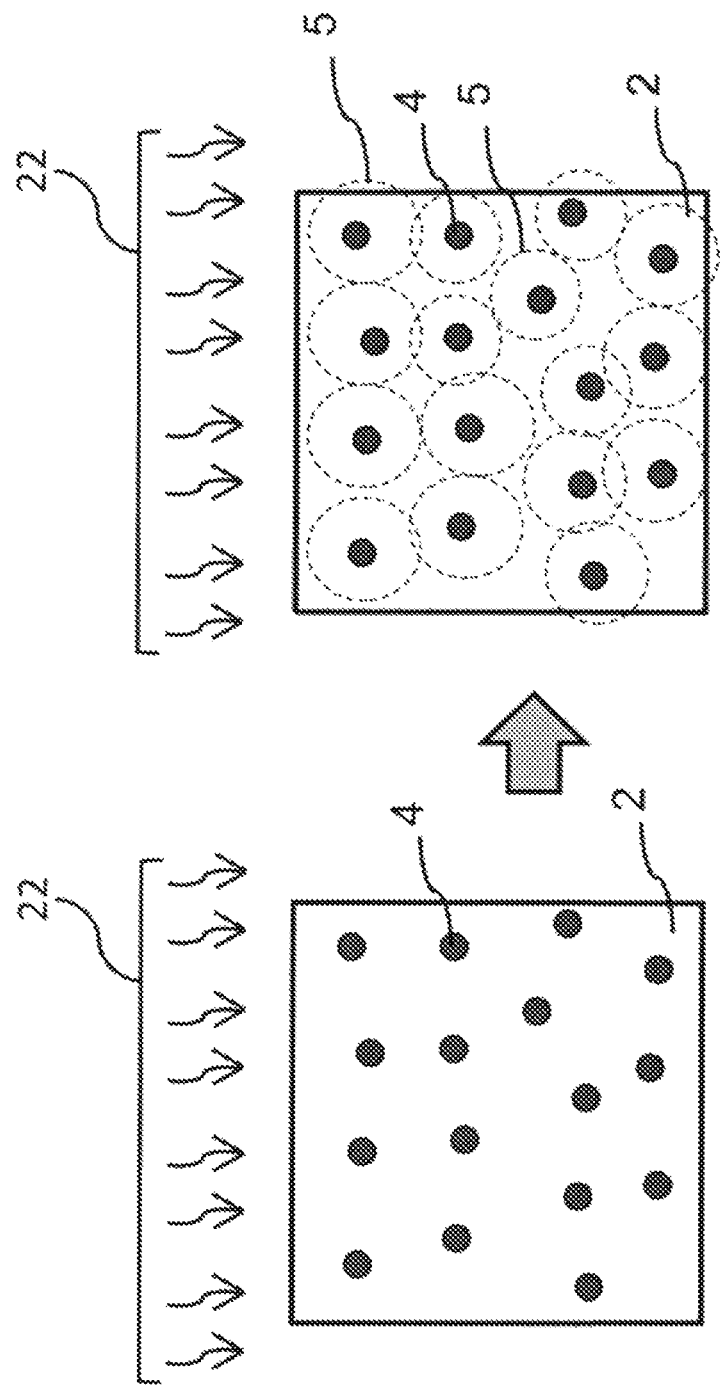
Figure 6:
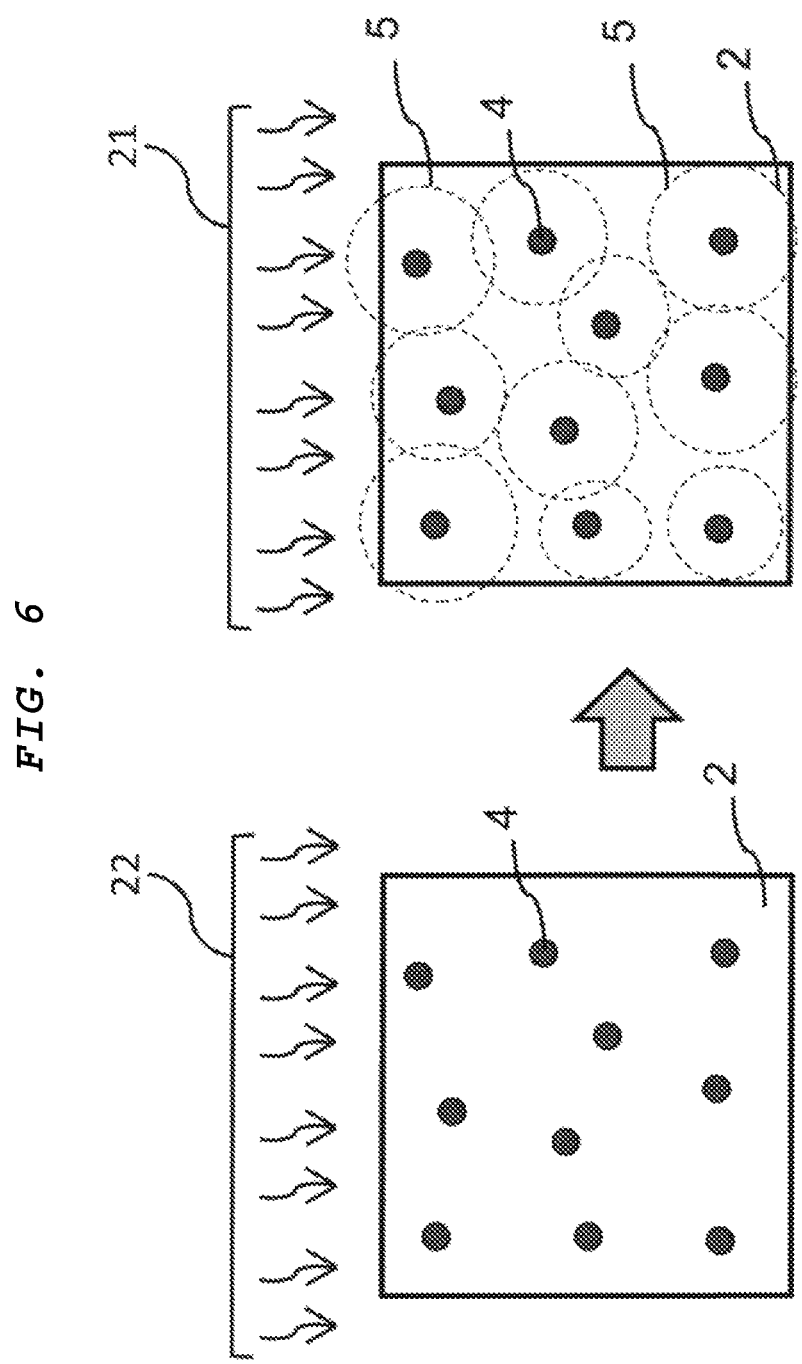

FIG. 4 through FIG. 6 schematically show the process of the crystal growth. In the following, an explanation will be made using FIG. 4 through FIG. 6 to describe the crystal growth.

First, FIG. 4 shows the process of the crystal growth when only the microwave 21 having a frequency around 5.8 GHz is used. When only the microwave 21 with a frequency around 5.8 GHz is irradiated on the amorphous silicon film 2, because the energy is small, numerous crystal nuclei 4 cannot be generated, and further, crystal nuclei 4 cannot be grown effectively. Therefore, grown crystal grains 5 (representing crystal grain diameter) is small.

Also, FIG. 5 shows the process of the crystal growth when only the microwave 22 having a frequency greater than 5.8 GHz is irradiated. As shown in FIG. 5, when only the microwave 22 with a frequency higher than 5.8 GHz is irradiated, many crystal nuclei 4 can be generated effectively. In detail, the microwave 22 with a frequency higher than 5.8 GHz has lower penetration into the film, compared to the microwave 21 with a frequency around 5.8 GHz, but the microwave 22 has a higher energy, making it possible to heat the amorphous silicon film 2 effectively and to generate effectively many crystal nuclei 4 in the amorphous silicon film 2. However, due to the fact that many crystal nuclei 4 are generated and strike one another, it becomes difficult to let each nucleus 4 grow large. Therefore, as shown in FIG. 5, the grown crystal grain 5 (crystal grain diameter) is small, leading to generation of a silicon crystal film with many crystal grain boundaries. Here, if a metallic conductive film exists below the amorphous silicon film 2, because of the microwave 22 with a frequency higher than 10 GHz, an eddy current is generated within the metallic conductive film, causing the metallic conductive film to generate heat, so the amorphous silicon film 2 is further heated with the generated heat, making it possible to effectively generate crystal nuclei 4.

On the other hand, FIG. 6 shows the process of the crystal growth when irradiating the semiconductor substrate 1 with the microwave 21 having a frequency around 5.8 GHz (the first frequency) and the microwave 22 with a frequency greater than the first frequency, namely greater than 5.8 GHz. First, because amorphous silicon film 2 can be effectively heated by irradiating the microwave 22 with a frequency higher than 5.8 GHz, as shown in FIG. 6, crystal nuclei 4 can be effectively generated in amorphous silicon film 2. Further, the microwave 21 with a frequency around 5.8 GHz is used. This microwave 21 with a frequency around 5.8 GHz has a greater ability to penetrate the film compared to the microwave 22 with a frequency higher than 5.8 GHz, making it possible to promote the twisting vibration among atomic bonds. Therefore, effective re-composition of atomic bonds can be generated, and as shown in FIG. 6, each nucleus 4 can be grown larger (crystal growth), producing a silicon crystal film with less crystal grain boundaries.

Specifically, according to this embodiment, crystal nuclei can be generated effectively by using the microwave 22 with a frequency higher than 5.8 GHz, and can further grow each crystal nucleus large (crystal growth) by using the microwave 21 with a frequency around 5.8 GHz, making it possible to obtain a high quality silicon crystal film 3 with minimal grain boundaries.

Figure 7:
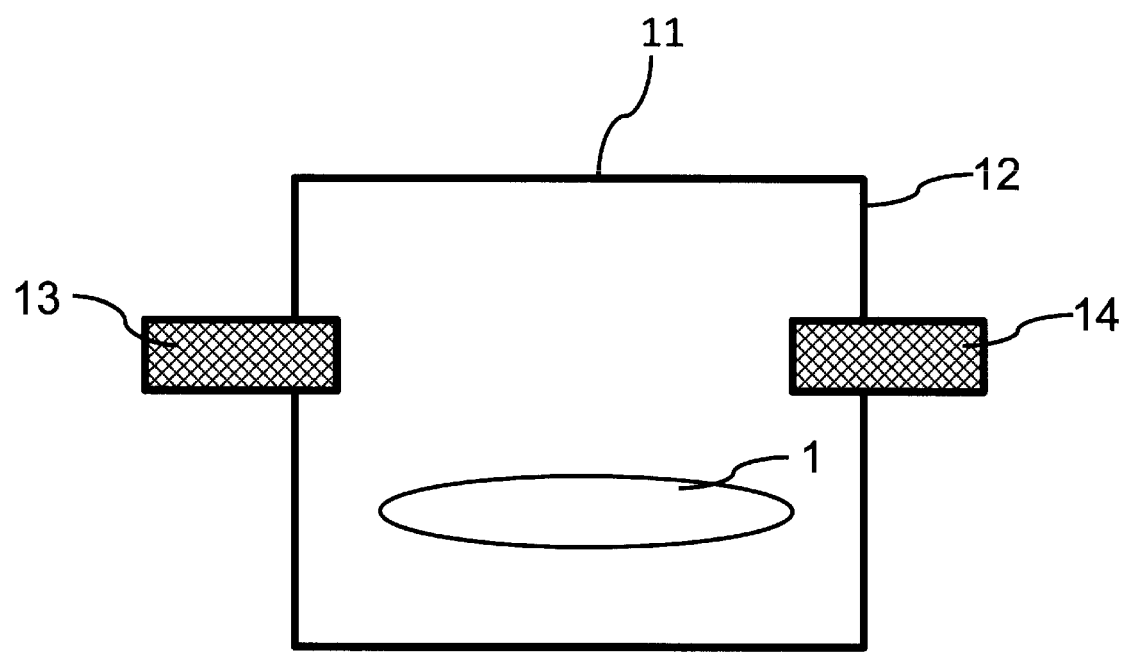
FIG. 7 is a schematic drawing of a semiconductor manufacturing apparatus according to the first embodiment.

One example of a semiconductor manufacturing apparatus according to this embodiment will be explained using a schematic drawing. FIG. 7 shows a semiconductor manufacturing apparatus 11, which can simultaneously introduce the microwave 21 with a frequency around 5.8 GHz and the microwave 22 with a frequency greater than 5.8 GHz into a process chamber 12 in which a semiconductor substrate 1 is processed.

Specifically, as can be understood from FIG. 7, the semiconductor manufacturing apparatus 11 according to this embodiment has the process chamber (film growing chamber) 12, in which the semiconductor substrate 1 is transferred thereto; a waveguide (the first waveguide) 13, which introduces the microwave 21 with a frequency around 5.8 GHz into the process chamber 12; and a waveguide (the second waveguide) 14, which introduces the microwave 22 with a frequency higher than 5.8 GHz into the process chamber 12. By using the semiconductor manufacturing apparatus 11, as shown in FIG. 7, it is possible to execute a manufacturing method for the semiconductor device of the first embodiment, explained above. Here, the waveguides 13 and 14 have low attenuation rates of the microwaves 21 and 22, and are installed in such a way so that the frequencies of the microwaves 21 and 22 will not be disturbed by external factors and the like.

Second Embodiment

A second embodiment is different from the first embodiment in that the microwave 21 with a frequency around 5.8 GHz is irradiated onto the semiconductor substrate 1 to further grow each crystal nucleus larger after crystal nuclei are generated effectively in the amorphous silicon film 2 by irradiating the microwave 22 with a frequency greater than 5.8 GHz onto the semiconductor substrate 1. By doing so, the process of crystal nuclei generation by the microwave 22 and the process of re-composition (crystal growth) of bonds by the microwave 21 are performed consecutively. Here, the irradiations of the microwaves 21 and 22 with two different frequencies can be executed consecutively in the same process chamber, or in different process chambers, depending on the most suitable way according to a desired manufacturing process.

In the following, the manufacturing process of the semiconductor device of the second embodiment will be explained using FIG. 8. Here, the explanation of elements common with the first embodiment will be omitted for brevity. Also, as in the first embodiment, explanation will be made using the example in which the amorphous silicon film 2 is formed on the semiconductor substrate 1 and the silicon crystal film 3 is formed by irradiating a microwave on the amorphous silicon film 2; however, this disclosure is not limited to this and can be applied to other processes and materials.

Figure 8A:
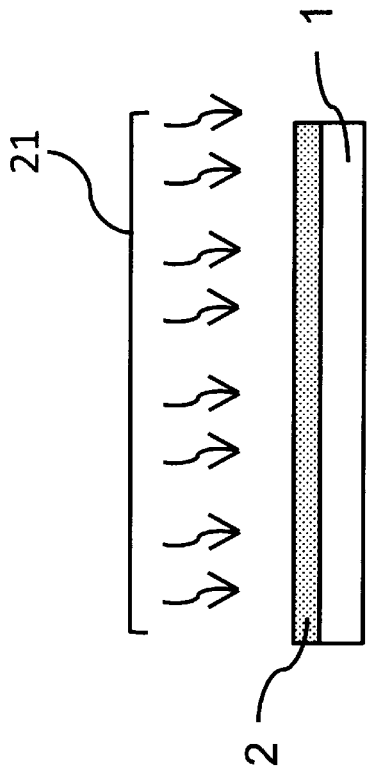
FIGS. 8A to 8D are cross sections, showing a manufacturing method of a semiconductor device according to a second embodiment.

First, as shown in FIG. 8A, as in the first embodiment, the amorphous silicon film 2 is formed on the semiconductor substrate 1.

Figure 8C:
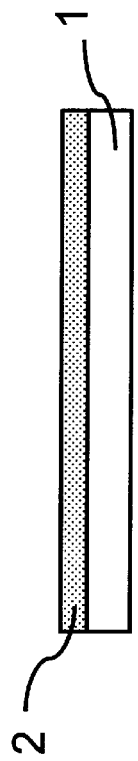
Figure 8B:
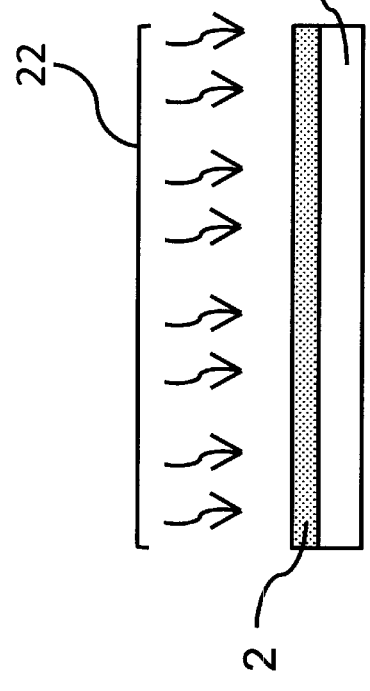

Further, as shown in FIG. 8B, the microwave 22 with a frequency greater than 5.8 GHz is irradiated onto the semiconductor substrate 1. In detail, as in the first embodiment, the frequency of the microwave 22 is 8 GHz or higher, such as a frequency within the range from 20 GHz to 30 GHz. By doing this, crystal nuclei are effectively generated in the amorphous silicon film 2.

Figure 8D:
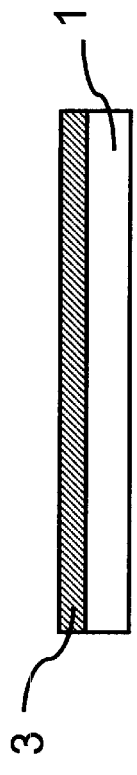

Next, as shown in FIG. 8C, the microwave 21 with a frequency around 5.8 GHz is irradiated onto the semiconductor substrate 1. By doing this, crystal nuclei can be effectively grown in the amorphous silicon film 2 and the silicon crystal film 3 can be obtained as shown in FIG. 8D.

As in the first embodiment, the duration of irradiation of the microwaves 21 and 22 is to be selected as the most suitable time period. Factors such as the properties of the material and the surface area of the material to which microwaves are irradiated, the properties of the material and the surface area of the material to which microwaves are not irradiated, and further the properties and type of the semiconductor device to be obtained by the process. The power of the irradiated microwaves 21 and 22 are, for example, between 1,500 and 2,500 W. The power density is, for example, set from 2.1 W per square centimeter to 3.6 W per square centimeter. Also, the temperature of the semiconductor substrate 1 may vary during the irradiation of the microwaves 21 and 22 varies depending on the process conditions, but the temperature of the semiconductor substrate 1 may be maintained below 500° C.

According to this embodiment, similar to the first embodiment, by irradiating the microwave 22 with a frequency greater than 5.8 GHz, crystal nuclei can be effectively generated, and further, by irradiating the microwave 21 with a frequency around 5.8 GHz, each crystal nucleus can be enlarged, allowing a high quality silicon crystal film 3 with less grain boundaries to be obtained.

Also, in this embodiment, similar to the first embodiment, the semiconductor manufacturing device 11, shown in FIG. 7 explained above, can be used.

Third Embodiment

A third embodiment differs from the second embodiment in that the semiconductor substrate 1 is cooled from the backside (side opposite the side that is irradiated) when the microwave 21 with a frequency around 5.8 GHz is irradiated. By doing this, the characteristic of the microwave 21 with a frequency around 5.8 GHz can be enhanced, allowing for the re-composition of atomic bonds to take place effectively, and each crystal nucleus to grow large.

The manufacturing method of the semiconductor device of this embodiment is the same as that of the second embodiment, except the fact that semiconductor substrate 1 is cooled from the backside; therefore, detailed explanations of the elements common with the second embodiment are omitted for brevity. Also, as in the first and the second embodiments, explanation will be made using the example in which a silicon crystal film 3 is provided by forming the amorphous silicon film 2 on the semiconductor substrate 1 and irradiating the microwaves 21 and 22 onto the amorphous silicon film 2. However, the disclosure is not limited to this and can be applied to other processes and materials.

In this embodiment, as in the second embodiment, crystal nuclei are formed in the amorphous silicon film 2 by irradiating the semiconductor substrate 1 with the microwave 22 having a frequency greater than 5.8 GHz. Next, while the semiconductor substrate 1 is being cooled, the microwave 21 having a frequency around 5.8 GHz is irradiated onto the semiconductor substrate 1. In detail, one of the methods for cooling the semiconductor substrate 1 includes flowing a gas onto the backside of semiconductor substrate 1. The gas may be inert gases such as a nitrogen gas, a helium gas, or an argon gas. The gas may be a refrigerant gas having a temperature of about room temperature or below. The device to perform the method includes pipes installed in a susceptor or stage (quartz board) supporting the substrate to let the refrigerant flow through the quartz board about the backside of the semiconductor substrate 1.

By cooling the semiconductor substrate 1 in this manner, it becomes possible to suppress the temperature rise of the semiconductor substrate 1, in which the generation of crystal nuclei is promoted. This further increases the number of crystal nuclei, and increases the irradiating power of the microwave 21 with a frequency around 5.8 GHz, which makes it possible to bring out more characteristic effect of the microwave 21. Therefore, as explained earlier, the twisting vibration of atomic bonds is promoted, allowing atomic bonds to be recomposed effectively, and a silicon crystal grain to grow larger from each crystal nucleus.

According to this embodiment, as in the first embodiment, by irradiating the microwave 22 with a frequency higher than 5.8 GHz, crystal nuclei can be generated effectively, and by irradiating the microwave 21 with a frequency around 5.8 GHz, each crystal nucleus can be grown larger, making it possible to obtain a high quality silicon crystal film 3 with less grain boundaries. And by cooling the semiconductor substrate 1 while the microwave 21 is irradiated, the irradiation power of the microwave 21 with a frequency around 5.8 GHz can be increased, while the temperature rise of the semiconductor substrate 1 is suppressed, making it possible to effectively grow crystal nuclei larger.

Figure 9:
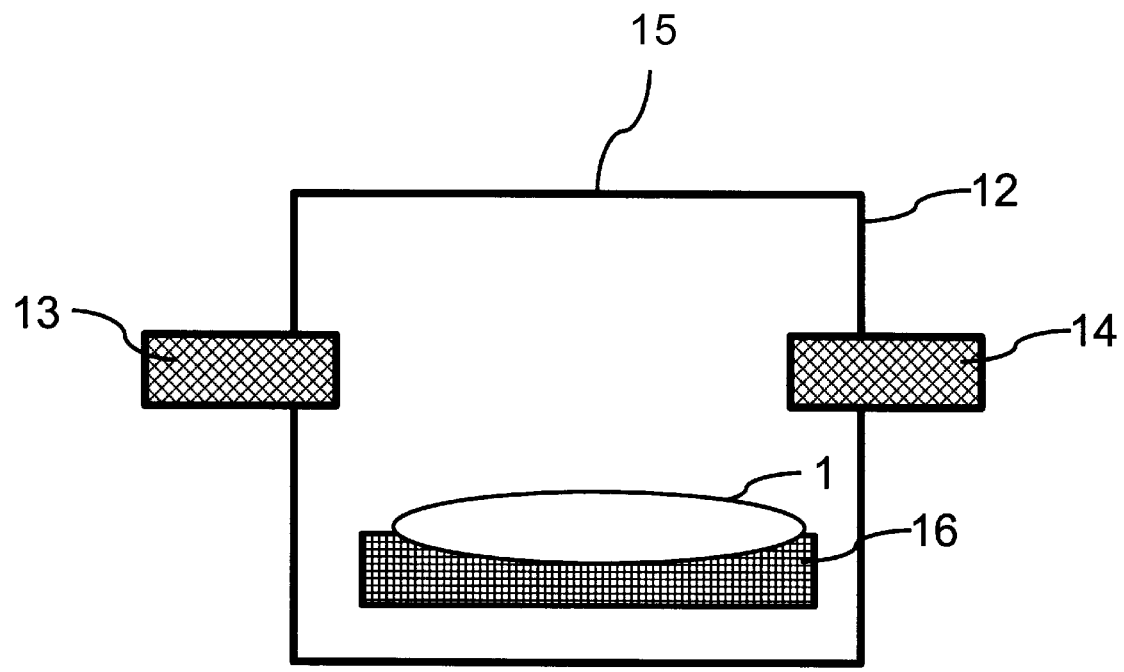
FIG. 9 is a schematic drawing of a semiconductor manufacturing apparatus according to a third embodiment.

Also, in this embodiment, a semiconductor manufacturing apparatus 15 shown in FIG. 9 can be used. Here, the explanation of elements common with the semiconductor manufacturing apparatus 11 shown in FIG. 7 is omitted for brevity, but the semiconductor manufacturing apparatus 15 shown in FIG. 9 includes a cooling device 16 for cooling the semiconductor substrate 1 from its backside.

The first through the third embodiments, explained above, have been explained with the use of the microwaves 21 and 22 with different frequencies. However, this disclosure is not limited to two microwaves with different frequencies, and three or more microwaves with different frequencies can also be used to irradiate the semiconductor substrate 1. Also, in the example where three or more microwaves with different frequencies are irradiated in the third embodiment, the semiconductor substrate 1 can be cooled when at least one of the three microwaves is irradiated, so the embodiment is not particularly limited.

Fourth Embodiment

The fourth embodiment is different from the first through the third embodiments explained above in that each of the microwaves 21 and 22 to be irradiated will be frequency modulated or the phase modulated. By executing the frequency modulation or the phase modulation of the microwaves 21 and 22, it becomes possible to avoid a standing wave from forming on the semiconductor substrate 1 and to provide an effect by which the microwaves 21 and 22 uniformly irradiated onto the semiconductor substrate 1.

Figure 10A:
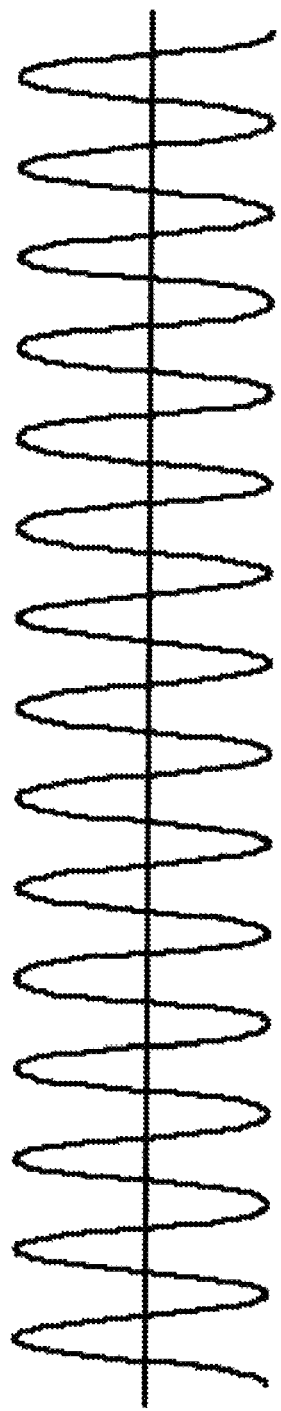
Figure 10B:
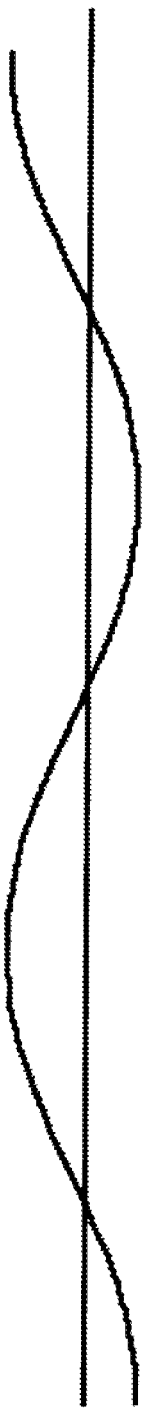

In the following, a manufacturing method of a semiconductor device according to this embodiment will be explained using FIGS. 10A to 10C that show the microwave used in this embodiment. In detail, FIG. 10A, for example, shows the microwave 21 or 22, which is a sine wave with the first and the second frequencies, and here, microwaves 21 or 22 are called carrier waves (the first and the second carrier waves.) To these carrier waves, using an X-wave, which is a sine wave shown in FIG. 10B (frequency×Hz) (the third and the fourth frequencies) as the signal wave (the first and the second signal waves), the frequency modulation is provided to generate a modulated wave shown in FIG. 10C. Here, the frequency of the X-wave, which is a signal wave, will be less than the frequency of the carrier wave. A frequency fm, which is the modulated wave to be obtained as the end result, is shown in the following equation (Equation 2.)

[Equation 2]

$$fm = fc + \Delta f \cos(2\pi fs \cdot t) \quad \text{(Equation 2)}$$

Here, fc represents a central frequency of a modulated wave, which is the same as the frequency of the carrier wave; Δf represents a maximum frequency shift; and t represents time (seconds).

Such frequency modulation is provided to each of the microwave 21 with a frequency around 5.8 GHz and the microwave 22 with a frequency higher than 5.8 GHz, and the two modulated waves thus obtained are irradiated onto the semiconductor substrate 1. At this time, the frequency of the frequency modulated microwave 21 is in the frequency band with the range of 5.8 GHz±3.35 GHz (from 2.45 GHz to 9.15 GHz). By doing this, it becomes possible to avoid the microwaves 21 and 22 from forming standing waves on the semiconductor substrate 1, and to irradiate the microwaves 21 and 22 uniformly onto the semiconductor substrate 1. The details thereof will be explained later.

Also, a signal wave can be generated by using an existing high frequency power source with a low frequency, which is easily obtainable.

Here, in this embodiment, an example in which the frequency modulation is provided is explained, but the phase modulation can be also provided.

According to this embodiment, as in the first embodiment, by irradiating the microwave 22 with a frequency greater than 5.8 GHz, it becomes possible to generate crystal nuclei effectively, and further, by irradiating the microwave 21 with a frequency around 5.8 GHz, it becomes possible to significantly grow each crystal nucleus, making it possible to obtain a high quality silicon crystal film 3. And in this embodiment, by using the frequency-modulated microwaves 21 and 22, it becomes possible to avoid the microwaves from forming standing waves on the semiconductor substrate 1, and to apply uniform effects by the microwaves 21 and 22 on the semiconductor substrate 1, making it possible to obtain a high quality uniform silicon crystal film 3 on the semiconductor substrate 1.

In this embodiment, as shown in FIG. 10C, due to the fact that the frequency of a frequency-modulated microwave changes with time, it is possible to avoid the position of crests and nodes of the microwave from being fixed on the semiconductor substrate 1. In other words, because it is possible to avoid the formation of standing waves in the microwave when irradiating the semiconductor substrate 1, the strength of the microwave on the semiconductor substrate 1 becomes uniform, making it possible to give the effect of the microwave uniformly on the semiconductor substrate 1. Therefore, if many fine elements need to be formed uniformly on the entire semiconductor substrate 1, this embodiment provides suitable uniformity so the fine elements can be obtained.

Specifically, in this embodiment, as in the first embodiment, by irradiating the microwave 22 with a frequency higher than 5.8 GHz, it becomes possible to generate crystal nuclei effectively, and further by irradiating the microwave 21 with a frequency around 5.8 GHz, it becomes possible to significantly grow each crystal nucleus, making it possible to obtain a high quality silicon crystal film 3 with fewer grain boundaries. And by using the microwaves 21 and 22 with the frequency modulation, it is possible to avoid standing waves from being formed on the semiconductor substrate 1, and to provide the microwaves uniformly on the semiconductor substrate 1, making it possible to obtain a high quality uniform silicon crystal film 3 on the semiconductor substrate 1.

Figure 11:
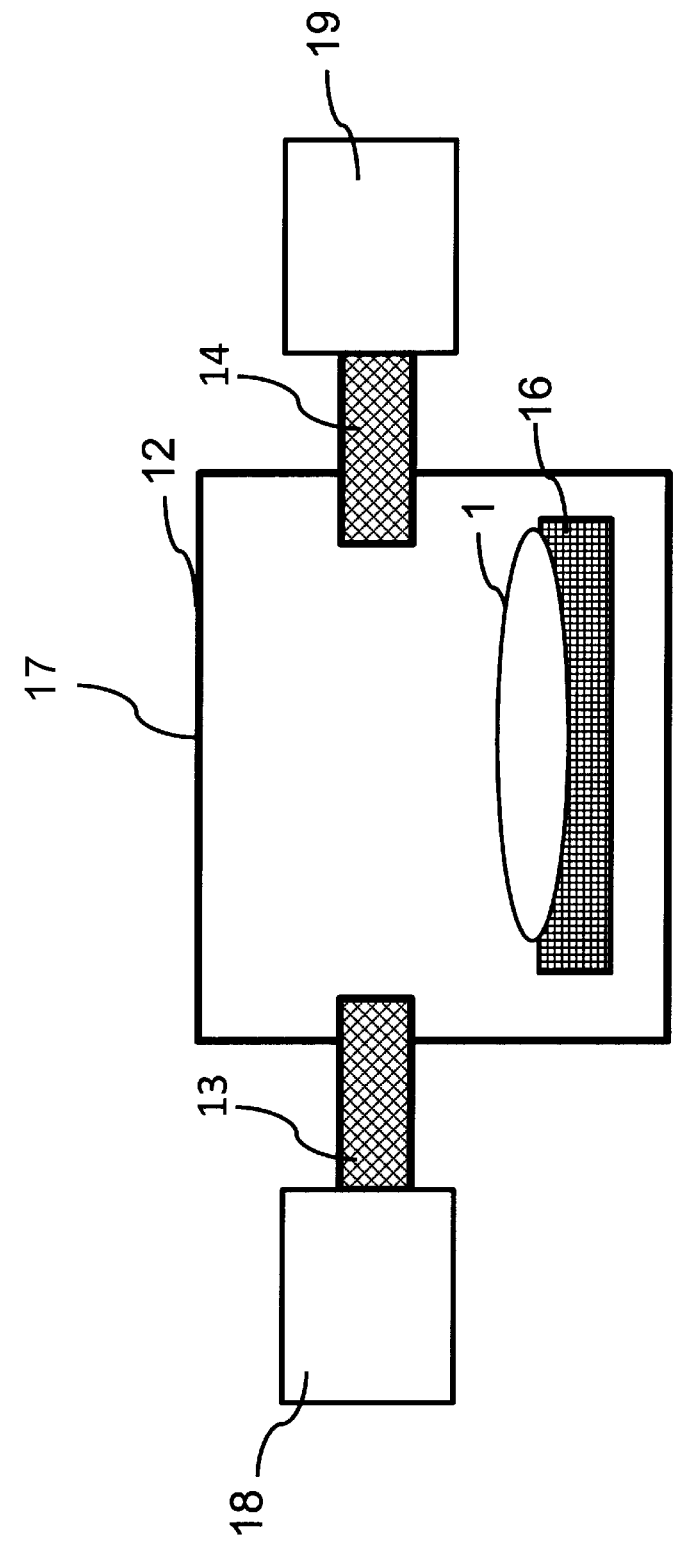
FIG. 11 is a drawing of a semiconductor manufacturing apparatus according to the fourth and a fifth embodiments.

Also, in this embodiment, a semiconductor manufacturing apparatus 17, shown in FIG. 11, can be used. Here, the explanations of elements common with the semiconductor manufacturing apparatus 15, shown in FIG. 9, will be omitted for brevity, but the semiconductor manufacturing apparatus 17, shown in FIG. 11, is a device in which microwave frequency modulation devices 18 and 19 are installed to the semiconductor manufacturing apparatus 15, shown in FIG. 9. These microwave frequency modulation devices 18 and 19 are devices to provide frequency modulation or phase modulation of the carrier wave, which is a sine wave of the microwave 21 or 22, by the signal wave, which is a sine wave with a frequency lower than the frequency of the carrier wave.

Figure 12:
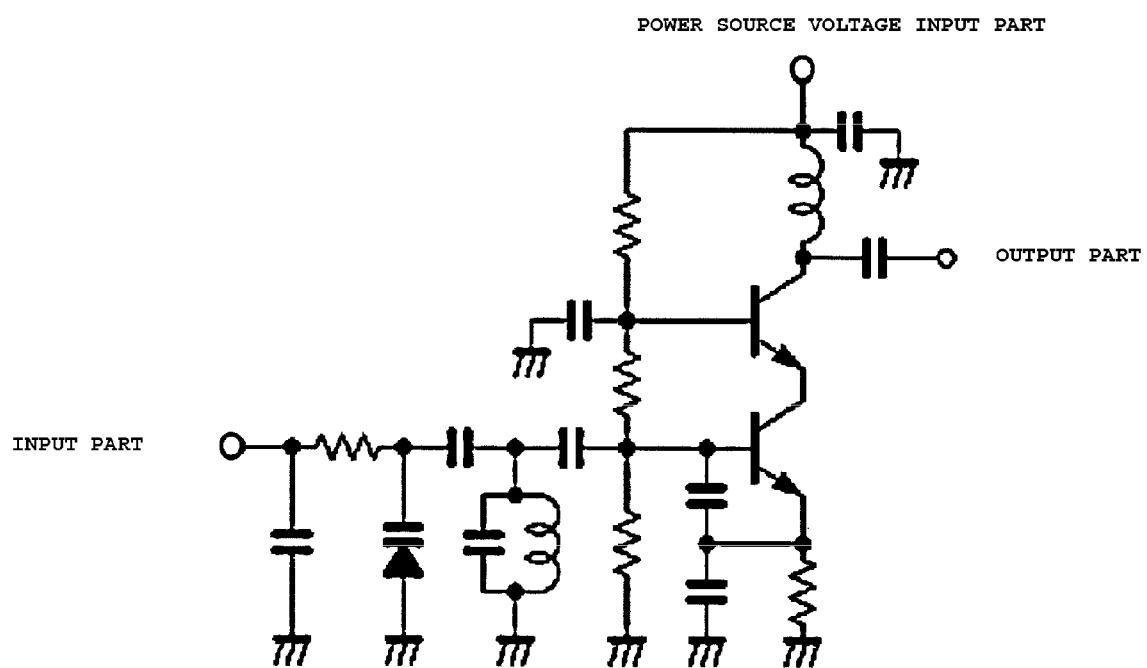
FIG. 12 is a drawing to explain a frequency modulation circuit of the fourth and the fifth embodiments.

An example of a modulation circuit, included in microwave frequency modulation devices 18 and 19 of this embodiment is shown in FIG. 12. In this modulation circuit, a carrier wave is input from a modulation circuit input part, and a signal wave is input from a power source voltage input part, as power source voltage. By doing this, a modulated wave is output from a modulation circuit output part. Here, this embodiment is not limited to using a modulation circuit such as the one shown in FIG. 12, but a variety of known modulation circuits can be used.

Fifth Embodiment

The fifth embodiment is different from the fourth embodiment in that the microwaves 21 and 22 are frequency-modulated or phase-modulated, not by a sine wave but a pulse wave as a signal wave. As in the fourth embodiment, by frequency-modulating or phase-modulating the microwaves 21 and 22, it is possible to avoid forming a standing wave on the semiconductor substrate 1, and to give the effect of uniform irradiation of the microwaves 21 and 22 onto the semiconductor substrate 1.

Figure 13A:
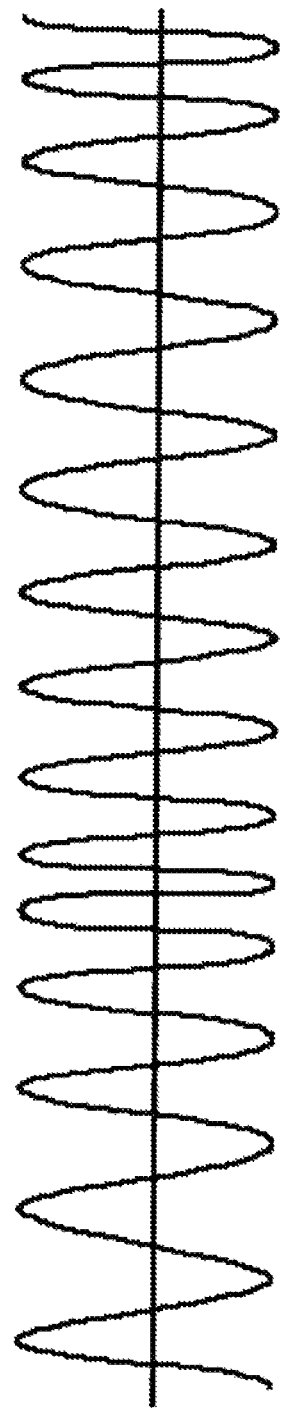
Figure 13B:
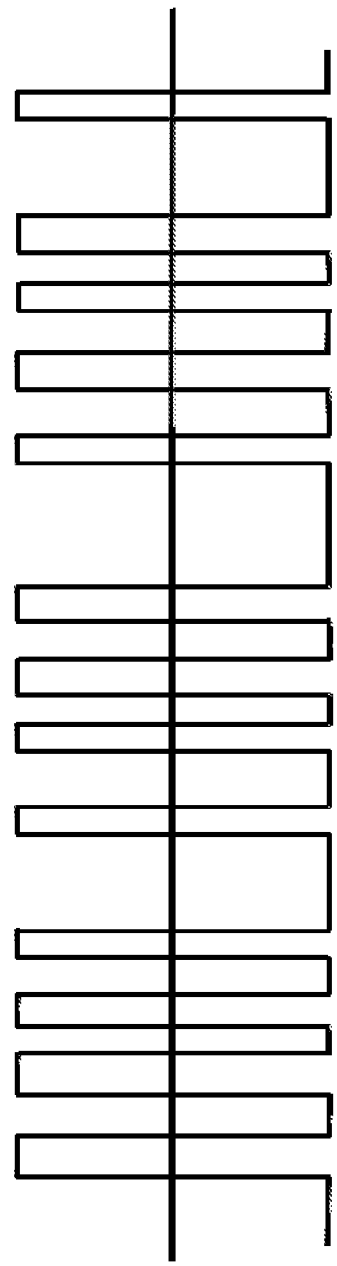

FIGS. 13A to 13C are drawings to explain the fifth embodiment herein, where the waveform of microwaves 21 and 22 that may be used in a manufacturing method of the semiconductor device according to the first through fourth embodiments. FIGS. 13A to 13C are drawings showing frequency modulation of the microwaves 21 and 22 that may be used in a manufacturing method for a semiconductor device. Here, explanations on the parts in common with the fourth embodiment are omitted. Also, as in the first through the fourth embodiment, explanation will be made using the case, as example, in which the amorphous silicon film 2 is formed on the semiconductor substrate 1, and the silicon crystal film 3 is formed by irradiating the microwaves 21 and 22 to the amorphous silicon film 2, but this disclosure is not limited to this and can be applied to other processes and materials.

In detail, FIG. 13A shows the microwave 21 or 22, which is a sine wave, and here, the microwaves 21 and 22 are called carrier waves. To these carrier waves, the frequency modulation is provided by using an X-wave (frequency×Hz), which is a pulse wave shown in FIG. 13B, as a signal wave to make the modulated wave shown in FIG. 13C. Here, as in the fourth embodiment, the frequency of the X-wave is smaller than the frequency of the carrier wave. Also, a frequency fm of the modulated wave obtained can be shown in Equation 2, as in the fourth embodiment. And the signal wave can be generated easily by using a readily available existing power source.

This frequency modulation is executed to each of the microwave 21 with a frequency around 5.8 GHz and the microwave 22 with a frequency greater than 5.8 GHz, and the two obtained modulated waves are irradiated onto the semiconductor substrate 1. At this time, the frequency of frequency-modulated the microwave 21 is a frequency included in the frequency band within the range between 5.8 GHz±3.35 GHz (from 2.45 GHz to 9.15 GHz).

In this embodiment, as in the first embodiment, by irradiating the microwave 22 with a frequency higher than 5.8 GHz, it becomes possible to generate crystal nuclei effectively, and further, by irradiating the microwave 21 with a frequency around 5.8 GHz, it becomes possible to significantly grow each crystal nucleus, making it possible to obtain a high quality silicon crystal film 3 with less grain boundaries. And as in the fourth embodiment, by using the microwaves 21 and 22 in frequency-modulated forms, it is possible to avoid forming standing waves on the semiconductor substrate 1, and to provide the microwaves 21 and 22 uniformly onto the semiconductor substrate 1, making it possible to obtain a high quality silicon crystal film 3 formed uniformly on the semiconductor substrate 1.

Also, in this embodiment, as in the fourth embodiment, the semiconductor manufacturing apparatus 17 shown in FIG. 11 can be used, and the modulation circuit shown in FIG. 12 can be further used.

Here, in the fourth and fifth embodiments, explanations are made in which the microwaves 21 and 22 with two different frequencies are both frequency-modulated, but this disclosure is not limited to two microwaves with different frequencies, and three or more microwaves with different frequencies can be used. Also, it is not limited to the example in which all microwaves are frequency-modulated or phase-modulated, but at least one microwave may be frequency-modulated or phase-modulated.

Now, in the first through the fifth embodiment explained so far, explanations have been made on the process in which the silicon crystal film 3 is obtained by crystallizing the amorphous silicon film 2, formed on the semiconductor substrate 1, but this disclosure is not limited to this. For example, it can be applied to the processes in the manufacturing process of the semiconductor device as described below.

First Modified Example

First, as one example, during a manufacturing process of a semiconductor device such as a transistor, when conductive dopants such as P, B and As are implanted into a semiconductor layer on a semiconductor substrate, the microwaves 21 and 22 with two different frequencies can be irradiated as in the embodiments described above. By doing this, conductive dopants can be activated and a crystal defect in the semiconductor layer caused by the ion implantation can be restored, making it possible to form a dopant injection layer in which crystal defects do not continuously exist. Further, the restored areas can be provided as high quality layers with less crystal grain boundaries.

Figure 14B:
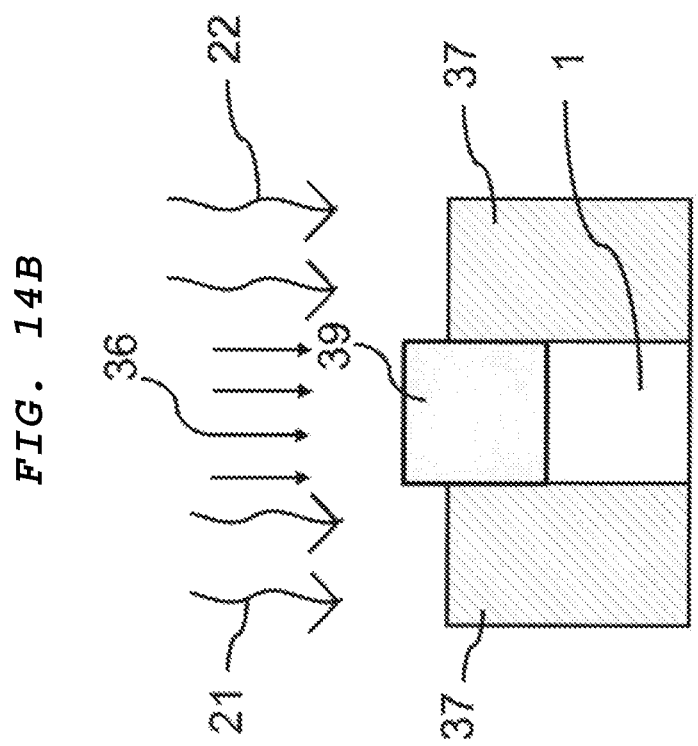

In detail, the explanation of this embodiment is made by referring to FIGS. 14A to 14C, which are cross sections of the main part of a semiconductor device. FIGS. 14A to 14C show the manufacturing process of the semiconductor device according to this embodiment. Here, explanations are made using, as an example, a manufacturing method of a two-layer gate electrode-type transistor of a nonvolatile semiconductor memory device, but it can be applied to the manufacturing methods of transistors with other configurations. Here, this two-layer gate electrode-type transistor is a cell transistor that constitutes a semiconductor memory device.

First, a semiconductor layer (semiconductor substrate) 1 as shown in FIG. 14A is prepared. This semiconductor layer 1, for example, is formed of silicon, and can have a p-type or an n-type conductivity according to the conductivity type of the transistor to be formed. Then, on the semiconductor substrate 1, an inter-layer insulation film 37 is formed using the CVD method or other methods. This inter-layer insulation film 37 can be formed, using, for example, a silicon oxide film. Further, on this semiconductor substrate 1, a tunnel insulation film (not shown), a first polysilicon film (charge accumulation film/floating gate (not shown)), an Inter-Poly Dielectric (IPD) film (Inter-electrode insulation film (not shown)) and a second polysilicon film (control gate electrode (not shown)) are laminated sequentially, and these films are processed, using the RIE (Reactive Ion Etching), or the like, to form a gate configuration with a desired shape that includes these films. In detail, the tunnel insulation film, for example, is formed of a silicon oxide, a hafnium-based oxidation film (for example, $HfO_2$) or a silicon oxide nitride film (for example, HfSiON) and on the like. Here, if the tunnel insulation film is a silicon oxide, it can be formed by the thermal oxidation method and so on. Also, the first polysilicon film and the second polysilicon film can be formed by, for example, the CVD method, or the like, using silane or disilane. Further, the IPD film is formed of, for example, an ONO (Oxide Nitride Oxide) film. This ONO film is a film with a laminated structure, which include a silicon oxide film, a silicon nitride film formed on this silicon oxide film, and a silicon oxide film formed on this silicon nitride film. The silicon oxide film that constitutes this ONO film can be formed by a thermal oxidation method or the like, and the silicon nitride film can be formed by the CVD method or the like.

Next, as shown in FIG. 14B, using the ion implantation method, a dopant injection layer 39 (doped layer) is formed by implanting a conductive dopant 36 such as As, P, B and $BF_2$ into the surface of the semiconductor layer 1, for example, under the condition in which the acceleration energy is between 1 keV and 60 keV, and the dopant concentration is between 1E15 and 1E16 $cm^{-2}$. At that time, to restore the crystal defect in the dopant injection layer 39, generated by the injection of the conductive dopant 36, it is effective to irradiate a microwave, for example, with the frequency of 5.8 GHz and the power higher than 5 kW, while cooling the semiconductor substrate 1 with a nitrogen gas, or the like, so that the substrate temperature of the semiconductor substrate 1 will not rise over 800° C. However, if crystal defects continue to exist, as in the embodiments explained so far, by irradiating, from the upper side of the semiconductor layer 1, the microwaves 21 and 22 with two different frequencies, namely the microwave 21 with a frequency around 5.8 GHz and the microwave 22 with a frequency greater than 5.8 GHz, the density of crystal defect can be reduced.

In this way, by ion-implanting the conductive dopant 36 while irradiating the microwaves 21 and 22 with two different frequencies, it becomes possible to implement ion implantation while restoring the crystal defect caused by the ion implantation. By this, as shown in FIG. 14C, it is possible to form the dopant injection layer 39 in which the defects do not exist continuously.

Second Modified Example

Also, as another modified example, the microwaves 21 and 22 with two different frequencies can be irradiated during the formation of the insulating film in the manufacturing process of the semiconductor device. By doing this, as in the embodiments explained so far, an insulating film with fewer crystal grain boundaries and high insulating property can be obtained. In addition, by forming an insulating film by irradiating the microwave, unnecessary water or organic materials can be exhausted outside the film (outgassed), making it possible also to make a higher density insulating film. To be more specific, by irradiating the microwaves 21 and 22 with two different frequencies during the formation of the gate insulating film of the transistor, the crystal grain diameter in the gate insulating film can be made larger to obtain a high quality gate insulating film with less crystal grain boundaries, and therefore, the interface state density and the fixed charge density of the transistor can be reduced and so on.

Third Modified Example

Further, in the formation of a conducting layer such as wiring and contact plugs (vias), the two microwaves 21 and 22 with different frequencies can be used to irradiate the semiconductor device. Similar to the other embodiments described herein, by increasing the diameter of the crystal grain in the conducting layer, high quality films with fewer grain boundaries can be obtained, and the resistance at the conducting layer can be reduced. As one example, it is suitable when forming a silicide film. To be more specific, while irradiating the microwaves 21 and 22 with two different frequencies, namely, the microwave 21 with the frequency of 5.8 GHz and the microwave 22 with a frequency greater than 5.8 GHz, a conductive film, including a metallic film, a semi-metallic film, or a metallic compound film, which includes at least one atom selected from Ni, Al, Ti, Ni, Co, Cu, Mo, Pd, Ag, Sn, Mn, La, Hf, Ta, W and so on, is accumulated on a layer, including silicon atoms, and silicon atoms and atoms included in the conductive film are made to react to form a silicide film. By doing this, the grain diameter of each crystal grain can be made larger, and a high quality silicide film with fewer crystal grain boundaries can be formed. In addition, the resistance value of the silicide film can be further reduced.

Specifically, the embodiments and the modified examples of the embodiments described herein can be applied to semiconductor devices that are formed using various materials, including conducting films, semiconducting films, insulating films and the like, such as metallic films, metallic oxide films, silicon films, silicon oxide films, silicon nitride films, silicon nitride oxide films, and can enhance the quality of the films formed. Especially, by applying the fourth and the fifth embodiments, it is possible to form a high quality film uniformly over the entire semiconductor substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, comprising:
forming a crystal film on a semiconductor substrate by irradiating a first microwave energy at a first frequency and a second microwave energy at a second frequency higher than the first frequency, wherein the first microwave energy includes a first carrier wave that is frequency modulated or phase modulated.

2. The manufacturing method according to claim 1, wherein
the semiconductor substrate is cooled during irradiation of the first microwave.

3. The manufacturing method according to claim 1, wherein
the semiconductor substrate is rotated during irradiation of the first microwave.

4. The manufacturing method according to claim 1, wherein
the semiconductor substrate is rotated during irradiation of the second microwave.

5. The manufacturing method according to claim 1, wherein
the first carrier wave is a sine wave having the first frequency.

6. The manufacturing method according to claim 5, wherein
the second microwave energy includes a second carrier wave that is frequency modulated or phase modulated.

7. The manufacturing method according to claim 5, wherein
the first carrier wave is frequency modulated or phase modulated using a first signal wave which is a sine wave or a pulse wave with a third frequency lower than the first frequency.

8. The manufacturing method according to claim 7, wherein
the second carrier wave is a sine wave having a second frequency greater than the first frequency.

9. The manufacturing method according to claim 8, wherein
the second carrier wave is frequency modulated or phase modulated using a second signal wave which is a sine wave or a pulse wave with a fourth frequency lower than the second frequency.

10. The manufacturing method according to claim 1, wherein
the first microwave energy is obtained by providing frequency modulation or phase modulation of the first carrier wave which is a sine wave with the first frequency, using a first signal wave which is a sine wave or a pulse wave with a third frequency lower than the first frequency; and
the second microwave is obtained by providing frequency modulation or phase modulation of a second carrier wave which is a sine wave with the second frequency greater than the first frequency, using a second signal wave which is a sine wave or a pulse wave with a fourth frequency lower than the second frequency.

11. The manufacturing method according to claim 1, wherein
the semiconductor device comprises a silicon substrate having a doped layer.

12. A manufacturing method of a semiconductor device, comprising:
forming a crystal film on a semiconductor substrate by
irradiating the semiconductor substrate with a first microwave energy, obtained by providing frequency modulation or phase modulation of a first carrier wave which is a sine wave with a first frequency, using a first signal wave which is a sine wave or a pulse wave with a third frequency lower than the first frequency; and
irradiating the semiconductor substrate with a second microwave, obtained by providing frequency modulation or phase modulation of a second carrier wave which is a sine wave with a second frequency greater than the first frequency, using a second signal wave which is a sine wave or a pulse wave with a fourth frequency lower than the second frequency.

13. The manufacturing method according to claim 12, wherein
the semiconductor substrate is cooled during irradiation of the first microwave.

14. The manufacturing method according to claim 12, wherein
the semiconductor substrate is rotated during irradiation of the first microwave.

15. The manufacturing method according to claim 12, wherein
the semiconductor substrate is rotated during irradiation of the second microwave.

16. A semiconductor manufacturing apparatus, comprising:
a film formation chamber;
a first waveguide which provides a first microwave energy at a first frequency into the film formation chamber;
a second waveguide which provides a second microwave energy with a second frequency greater than the first frequency into the film formation chamber; and
a microwave modulation device to provide frequency modulation or phase modulation of the first microwave energy or the second microwave energy.

17. The semiconductor manufacturing apparatus according to claim 16, further comprising:
a cooling device for cooling the semiconductor substrate.

18. The semiconductor manufacturing apparatus according to claim 16, further comprising:
a cooling device for cooling the semiconductor substrate.

* * * * *